United States Patent [19]

Buron et al.

[11] Patent Number: 4,858,070
[45] Date of Patent: Aug. 15, 1989

[54] MODULAR EXPANDABLE HOUSING ARRANGEMENT FOR ELECTRONIC APPARATUS

[75] Inventors: Douglas J. Buron, Plantation; Sheldon Steinman, Miramar; Donald L. Wray, Lauderhill, all of Fla.

[73] Assignee: Racal Data Communications Inc., Sunrise, Fla.

[21] Appl. No.: 42,186

[22] Filed: Apr. 24, 1987

[51] Int. Cl.[4] .............................................. H05K 7/20
[52] U.S. Cl. .................................... 361/384; 361/391; 361/395; 361/413; 361/424; 439/607
[58] Field of Search ................................ 361/380–381, 361/383, 384, 391, 393–396, 399, 412, 413, 415; 439/65, 74–76, 248, 607

[56] References Cited

U.S. PATENT DOCUMENTS

| D. 272,249 | 1/1884 | Stillinger et al. | D14/109 |
|---|---|---|---|
| 3,253,190 | 5/1966 | Evans | 317/101 |
| 3,560,799 | 2/1971 | Bochicchio | 317/101 |
| 3,704,394 | 11/1972 | Johnson | 317/101 DH |
| 3,711,814 | 1/1973 | Pomella et al. | 339/65 |
| 4,091,440 | 5/1978 | Gelin et al. | 361/415 |
| 4,152,038 | 5/1979 | Inouye et al. | 339/75 M |
| 4,164,362 | 8/1979 | Cobaugh et al. | 339/17 M |
| 4,226,491 | 10/1980 | Kazama et al. | 339/17 LM |
| 4,322,120 | 3/1982 | Rilling | 339/47 R |
| 4,380,360 | 4/1983 | Parmer et al. | 339/17 CF |
| 4,401,351 | 8/1983 | Record | 339/17 LM |
| 4,437,717 | 3/1984 | Korzik et al. | 339/17 LC |
| 4,439,000 | 3/1984 | Kaufman et al. | 339/176 MP |
| 4,466,049 | 8/1984 | Chaney et al. | 361/383 |
| 4,477,862 | 10/1984 | Gonzales | 361/393 |
| 4,499,523 | 2/1985 | Gillett et al. | 361/383 |
| 4,501,460 | 2/1985 | Sisler | 339/49 R |
| 4,558,914 | 12/1985 | Prager et al. | 339/75 R |
| 4,595,249 | 6/1986 | Oehlert et al. | 339/17 LM |
| 4,630,175 | 12/1986 | Lerude et al. | 361/424 |

FOREIGN PATENT DOCUMENTS 3038719 10/1981 Fed. Rep. of Germany ...... 361/383

Primary Examiner—A. D. Pellinen
Assistant Examiner—Greg Thompson
Attorney, Agent, or Firm—Jerry A. Miller

[57] ABSTRACT

A modular housing for electronic apparatus includes an approximately C-shaped enclosure member having an inner portion and first and second sides. The enclosure member includes a male stacking enclosure connector on the first side; a female stacking enclosure connector on the second side; and a first cassette connector situated at the inner portion. A cassette for carrying an electronic apparatus engages the inner portion of the C-shaped enclosure member. The cassette includes a second cassette connector situated on the cassette suitable for engagement with the first cassette connector. A fan pulls air through the cassette through vents which mate with vents on the enclosure member.

18 Claims, 4 Drawing Sheets

MODULAR EXPANDABLE HOUSING ARRANGEMENT FOR ELECTRONIC APPARATUS

BACKGROUND

1. Field of the Invention

This invention relates generally to the field of housing assemblies for electronic equipment. More particularly this invention relates to a modular assembly which may be either stand-alone or rack mounted.

2. Background of the Invention

It is commonplace in many fields of electronics to require a plurality of circuit cards to mate together in various configurations to enable the circuit cards to share a common power supply. In many instances it is also desirable for the circuit cards to be able to communicate with one another or with the outside world. This goal is typically achieved by providing a traditional fixed card cage which contains a power supply and which has a plurality of slots with connectors wired to a back plane. The various circuit cards can then slide into the slots and mate with an appropriate connector in the backplane in order to access the common power supply and communicate with each other and the outside world. Typically, such conventional card cages have a built in power supply to power each of the cards.

However, this concept has a number of drawbacks. For example, typically the circuit cards used in this configuration are substantially unprotected from possible damage from handling and exposure to dust and foreign material. That is, when a circuit card is removed, its electronic components are exposed and easily damaged by contact with sources of static electricity or other undesirable forces. Moreover, it is difficult to provide adequate air circulation to properly cool the electronic components while simultaneously providing protection of the circuit cards by the card cage. In addition, such card cages are typically of fixed size accepting for example 8 or 16 circuit cards. Thus, even if only one circuit card or a small number of circuit cards are used, the entire card cage is needed, unduly occupying valuable space.

The present invention significantly improves upon the prior art in these respects and others.

SUMMARY OF THE INVENTION

It is an object of the present invention to provide an improved housing for circuit cards.

It is another object of the present invention to provide a modular housing for electronic cards which provides a modular cooling arrangement.

It is another object of the present invention to provide an improved modular housing arrangement for circuit cards including a protective cassette housing for circuit cards.

It is a further object of the present invention to provide a modular housing for circuit cards which may be either rack mounted or used in a stand alone or desk top environment.

These and other objects of the invention will become apparent to those skilled in the art upon consideration of the following description of the invention.

In one embodiment of the present invention a modular housing for electronic apparatus includes an approximately C-shaped enclosure member having an inner portion and first and second sides. The enclosure member includes a male stacking enclosure connector on the first side; a female stacking enclosure connector on the second side; and a first cassette connector situated at the inner portion. A cassette for carrying an electronic apparatus engages the inner portion of the C-shaped enclosure member. The cassette includes a second cassette connector situated on the cassette suitable for engagement with the first cassette connector. A fan pulls air through the cassette through vents which mate with vents on the enclosure member.

In another aspect of the present invention, a circuit card protecting cassette for use in conjunction with a cassette receiving apparatus includes a circuit card having an end with a housing substantially covering the circuit card, the housing having an end including an aperture at the end. A connector is situated at the end of the circuit card and passes through the aperture at the end of the housing, to provide electrical access for the circuit card. An air intake vent is situated on the housing for receiving cooling air for passing over the circuit card thereby heating the air and cooling the circuit card. An air exhaust vent, suitable for mating with a source of air suction in the cassette receiving apparatus, is provided for aspirating the heated air from the cassette.

In another aspect, an expandable enclosure module for receiving a circuit card housed in a circuit card cassette includes a housing having an approximately C-shaped opening for receiving the cassette, and has an upper chamber and a lower chamber. An exhaust chamber has a vent suitable for mating with an exhaust vent in the cassette and for receiving exhaust air therefrom. A transition circuit card has a cassette connector attached to the circuit card and suitable for mating with the circuit card when the circuit card cassette is inserted within the enclosure. A stackable connector coupled to the transition circuit card and passing through the housing at an approximately normal angle with the cassette connector mates the module together with other modules.

A method, according to this invention, for cooling an electrical apparatus housed within a cassette, the cassette including an intake vent and an exhaust vent, includes the steps of providing a first vent and a second vent in an enclosure module; installing the cassette within the enclosure module in a manner which mates the first vent with the exhaust vent; and coupling the second vent to a source of aspiration so that cooling air is drawn in through the intake vent, passed over the electrical apparatus, drawn out the exhaust vent and into the first vent and out the second vent.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
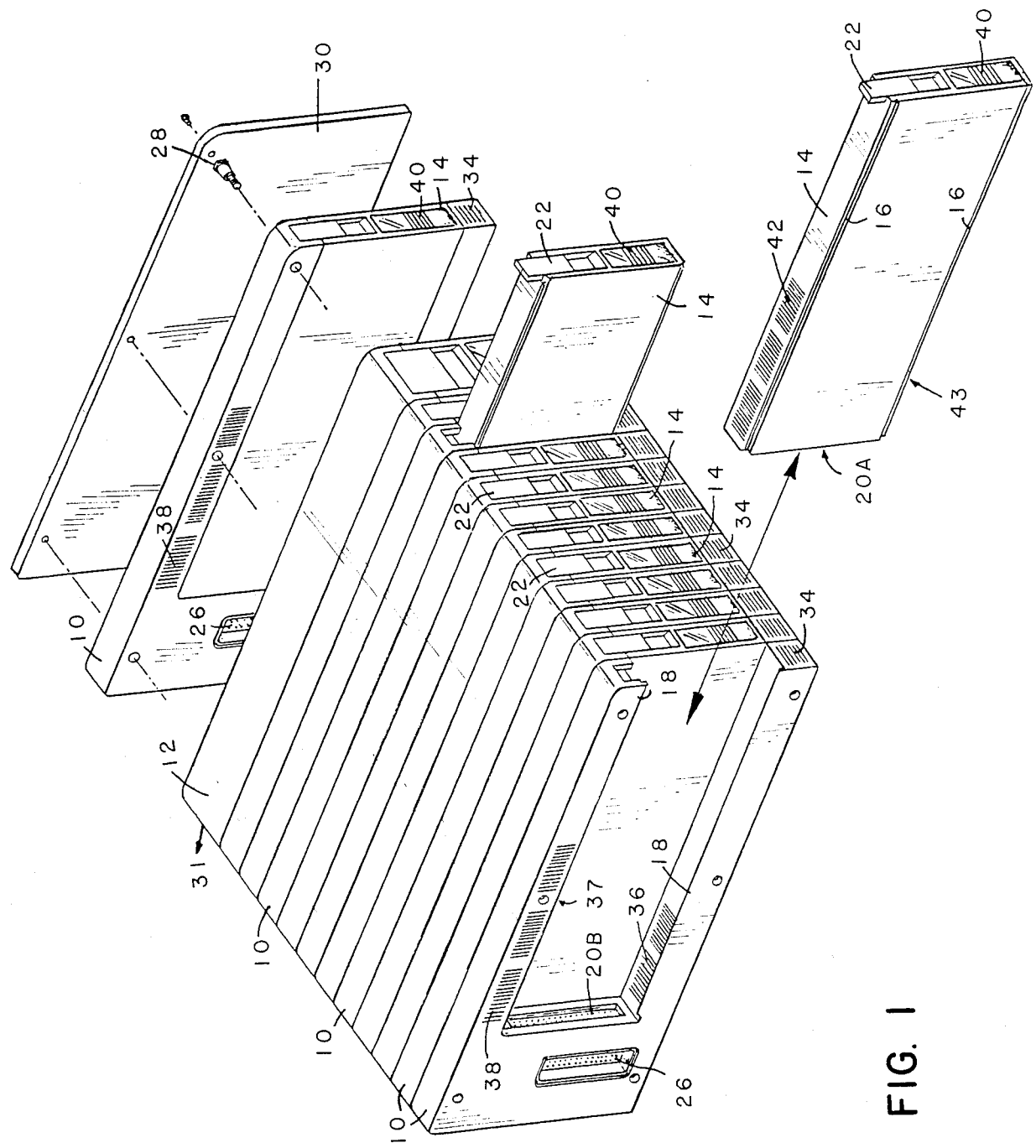
FIG. 1 shows an overall view of the modular housing assembly of the present invention.
Figure 2:
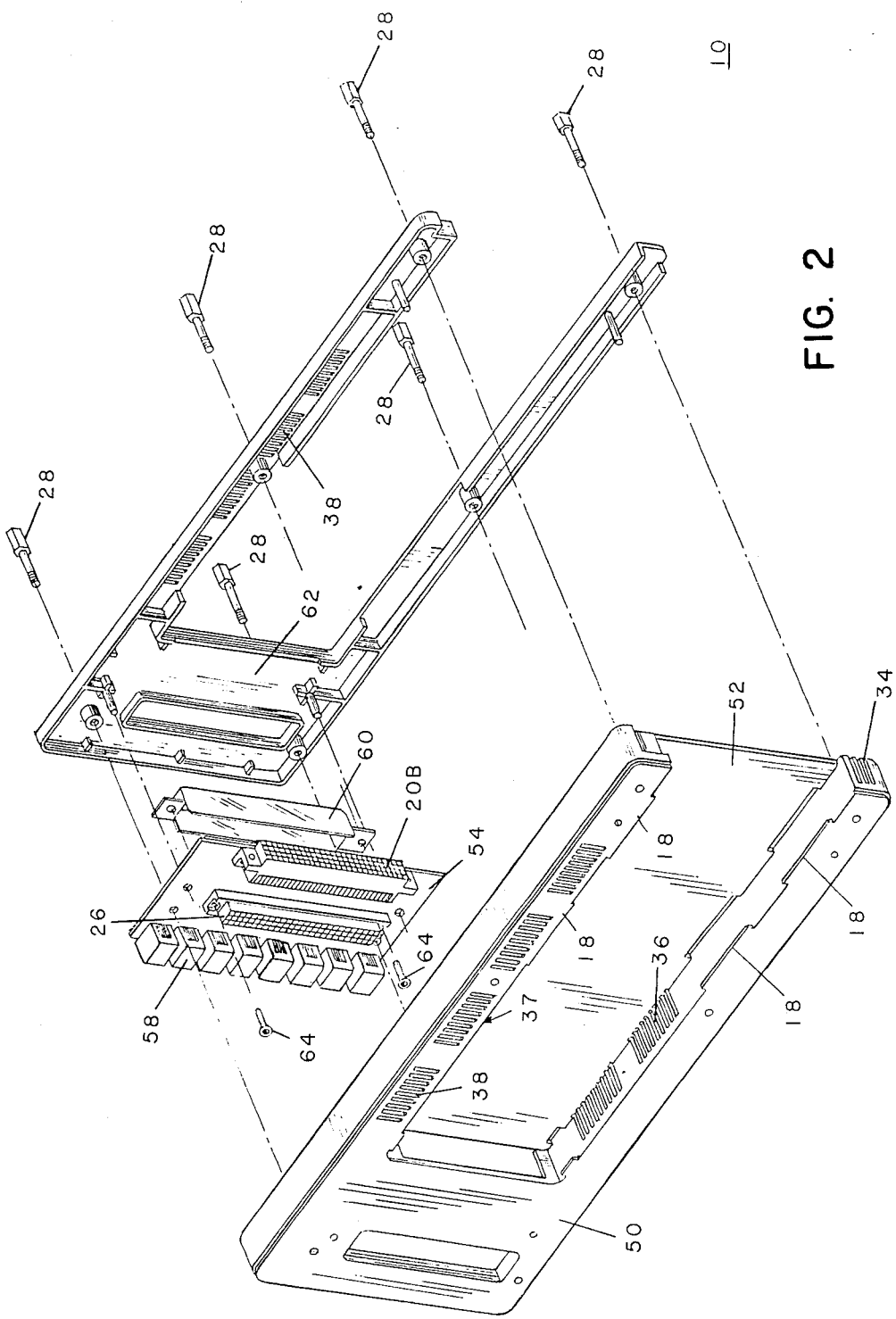
FIG. 2 shows a more detailed view of the expandable enclosure assembly used with the preferred embodiment.

Turning now to drawings in which like reference numerals represent identical or corresponding parts throughout the several views thereof, and in particular, to FIG. 1, the modular housing assembly of the present invention is shown. This housing assembly is made up of a plurality of expandable enclosure modules 10 which may be essentially identical. Each of these enclosures 10 is coupled electrically and mechanically to a power supply module 12 which supplies power to each of the several circuit cards of the assembly. A plurality of such power supply modules 12 may be used if required to adequately supply the power needs of the system. These enclosure members 10 are approximately C-shaped to accept a circuit card carrying cassette 14 as shown. Each of the cassettes 14 include a pair of rabbet grooves 16 at the bottom and top thereof adjacent one edge (bottom groove not shown clearly) which mate with corresponding upper and lower guide rails 18 situated on inner sides of the elongated C shaped enclosure members 10 adjacent one edge thereof. Many variations of the groove and rail are possible without departing from the present invention. For example, the groove may be made in the form of a channel running down the center of the upper and lower edges of the cassette, or the cassette may carry a rail and the housing member may carry the channel, or the rail may be substantially the whole length of 'C' as shown in FIG. 1, or it may be segmented as shown in FIG. 2. Other variations will occur to those skilled in the art.

On the back edge of each of the cassettes 14, a male high density connector 20A protrudes (not shown in this drawing) and mates with a corresponding female high density connector 20B accessible through an opening in the rear portion of the C shaped enclosures 10. The male high density connector may be similar in design to the commercially available model 533444-4 manufactured by AMP, Inc., Harrisburg, PA 17105. The female high density connector may be similar in design to the commercially available model 532434 also manufactured by AMP. The cassette 14 is also supplied with a cassette ejector 22 which is used to facilitate removal of the cassette from the C shaped enclosure members 10 as will be described later.

When fully engaged, cassette 14 is approximately flush with the ends of the 'C' of C-shaped enclosure 10 and the male portion of the high density connector 20A is firmly and fully engaged with the female portion of high density connector 20B. The cassettes are removed from enclosure members 10 by pulling outward on the lower portion of cassette ejector 22. This cassette ejector 22 has a pivoting action which pushes against the enclosure member 10 to facilitate disengagement of the cassette from the enclosure member 10. Such a mechanism is desirable since the cassette is approximately flush with the front of the enclosure member 10 when fully inserted and thus may be difficult to grasp. Once the high density conductor is disengaged, the cassette can easily be grasped and manually withdrawn from the enclosure member 10.

The enclosure members 10 are connected together electrically using a stackable connector 26 which is male on one side of the enclosure member and female on the opposite side. A commercially available stacking connector such as the model 534094-1 96 pin DIN connector manufactured by AMP or similar are suitable for use with the present invention. The pins are inserted through a plastic shroud such as the AMP model 533236-3 to complete the male side of the connector.

The enclosure members 10 are firmly attached together and secured by module fasteners 28 once installed. Module fasteners 28 are used to provide a secure connection between the enclosure members 10 and may be of any suitable design such as screws or quarter turn fasteners. In the preferred embodiment, the module fasteners are screw fasteners having a female thread on an enlarged end and a male thread on a narrower end. The enlarged end also has a hex head for ease of screwing in the male end. Thus, the male end of one connector is screwed into the female end of the other connector to facilitate connection of the enclosure members 10. The hex portion of the female end may be part of an enlarged portion which fits within a countersunk hole in the enclosure member to retain that enclosure member against an adjacent module.

An end cover is placed on each end of the modular assembly when all required enclosure members are mated together with a power supply 12. End cover 30 may include provisions for rack mounting so that the user may readily upgrade to a rack mounted system when his needs expand accordingly. Such provisions may include attached threaded members, portions of latches, hooks, dogs or other known fasteners suitable for facilitating connection to a rack as will be appreciated by those skilled in the art. The entire assembly shown in FIG. 1 may be provided with a U-shaped stand (not shown) which is integral with the end covers to fit around the sides and bottom of the assembly. This stand may provide rubber feet for table top use or rack mounting ears or the like for rack mounting may be provided to give the entire assembly additional strength in one embodiment. Such a stand may have metal reinforcements with a frame or channel along the length of the bottom for rigidity to help support the weight of the assembly. The stand may also provide additional electrical shielding if needed.

The power supply module is supplied with a standard commercially available switching regulator and radial blower exhaust fan which blows air out the rear-most portion of the power supply module at 31 and aspirates through each of the intake vents 37 and 38 of the enclosure members 10. In the preferred embodiment, the power supply module is also in the form of a cassette which has a special connector between the enclosure member and the cassette to provide D.C. electrical power to the cassette. Each of the enclosure members including the power supply module also includes an air intake 34 at the front. In addition, air vents 36 and 37 are provided adjacent the guide rails 18 on both the lower and upper portions respectively of the inside of enclosure members 10. Also, an air vent 38 is provided on each side of the enclosure members 10. The cassettes are also provided with an air intake 40 on the front surface thereof and width exhaust vents on the upper edge thereof designated 42. An intake vent 43 is also provided at the lower edge of the cassette 14.

When a cassette 14 is fully engaged in enclosure member 10, the upper and lower vents 42 and 43 mate with vents 37 and 36 in the enclosure member. The end covers 30 seal vent 38 of the enclosure member 10. Thus, the exhaust fan draws air in through intakes 34 and 40 and passes cooling air through the cassette and out through vents 37. Further cooling air is passed through the cassette via vents 36 and 43 at the lower edge of the cassette. In this manner, cool air is provided to both ends of the cassette to provide maximal cooling throughout the cassette so that the air near the cassette's exhaust 42 is not inordinately warm jeopardizing the reliability of components in that area.

Therefore, the lower portion of the C shaped enclosure member forms an air intake chamber and the upper portion of the C shaped enclosure member forms an exhaust air chamber. If a cassette is removed during operation, the radial blower exhaust fan has adequate capacity to continue pulling cooling air through each of the remaining cassettes thus affording continual reliable operation. This is assured by making the intake vents 37 of the enclosure members 10 relatively small compared with the vents in the cassette so that the amount of air drawn into the intake chamber is approximately constant whether or not a cassette is present in the enclosure member 10. Each power supply is therefore designed to draw cooling air through a predetermined maximum number of enclosure members, thus assuring an adequate supply of vacuum for all cassettes even if several cassettes are removed.

By creating separate intake and exhaust chambers, as described above, the relatively warm exhaust air can be readily kept separate from the cool intake air. This exhaust air is discharged out the rear of the assembly to further isolate the heated air from the cool air. The use of two intakes 40 and 43 allows for relatively even cooling of the circuit board or other assembly contained within the cassette 14. This is due to the location of the intake vents at approximately opposite ends of the cassette. The intake vent 34 allows cool air from the front of the assembly to be channeled to the rear of the cassette where the air would be relatively warm after having passed over the length of the cassette. Additionally, by providing vent 43 at a normal angle with vent 40, a degree of turbulence is created reducing the possibility of dead air space within the cassette. The vents themselves may be designed to further direct the flow of air so that there are no significant dead spots for heat buildup.

Turning now to FIG. 2, an exploded view of one embodiment of the C-shaped expandable enclosure 10 is shown in greater detail. Those skilled in the art will appreciate that many possibilities and variations in the exact configuration of the enclosure 10 exist. The enclosure assembly includes an enclosure member 50 which is approximately C shaped with a side wall 52 on one side adjacent the chamber for the cassette. This side wall assists in guiding the cassette into proper engagement with the rails 18. This enclosure member 50 accepts a transition card assembly 54 within the rear portion. The high density connector 20B and the stackable connector 26 are mounted to this transition card assembly 54. In addition, jacks and other types of connectors such as 8 pin RJ-11 jacks 58 may be supplied along the rear of transition card assembly 54 so that the circuit card plugged into the enclosure assembly 10 may access the outside world. The jacks 58 may be model 68899-002 eight pin telephone jacks available from Dupont, Inc., Berg Electronics, Camp Hill, PA 17011. Of course, other types of connectors such as RS-232 or the like may be used in place of RJ-11 jacks where desired. Or, in some instances, such jacks may be unnecessary altogether. A connector shield 60 is also coupled to the transition card 54 to provide electromagnetic interference shielding for connector 26 as will be described later in greater detail. The transition card is sealed in place with a cover 62 which allows passage with the rear of stackable connector 26 and closes the various air chambers as required to provide adequate sealing for the air system of the present invention. In another embodiment of this enclosure, a clam shell like assembly may be used, and in yet another variation, the enclosure 10 may be left open on one side to be sealed by either an adjacent enclosure 10 or by the end cover 30. Other variations will occur to those skilled in the art.

The shield 60 and stackable connector 26 are secured to the transition card 54 by a common pair of fasteners such as eyelets or the like 64. Connectors 58 are secured by the soldering of their pins. High density cassette connector 20B has a plurality (approximately 140) of soldered in pins which hold it in place but may be further secured by a pair of eyelets if desired or required.

Figure 3:
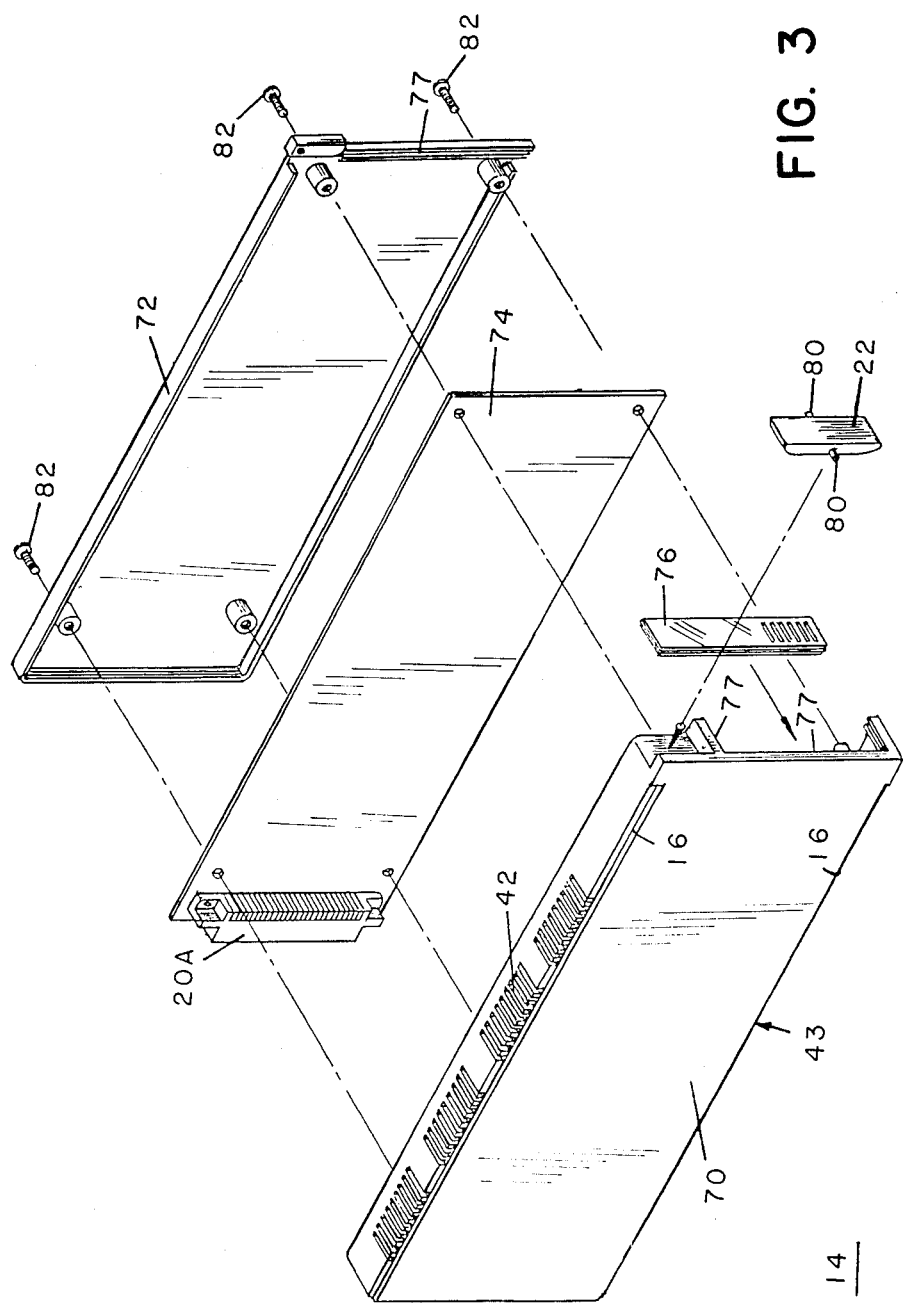
FIG. 3 shows a more detailed view of the circuit card cassette assembly of the preferred embodiment.

Turning now to FIG. 3, a more detailed view of one embodiment of cassette 14 of the present invention is shown. Other embodiments, are also possible without departing from the present invention. Cassette 14 includes a cassette enclosure 70 and a cassette cover 72 which are used to house and protect a circuit board 74 or other electronic apparatus (e.g. disk drive, tape drive, etc.). Circuit board 74 at its rear most portion includes a male high density connector 20A which mates with the female high density connector 20B of the enclosure assembly 10 as previously described. The high density connector is secured to the circuit board 74 by a plurality of soldered pins and may be further reinforced by a pair of screws or eyelets if required. Circuit board 74 may include various controls for indicator lights, etc., which are visible or accessible through a window 76. Preferably this window 76 is made of transparent tinted plastic so that indicator lights, displays and the like may be viewed through the window. It also may include apertures (not shown) which allow access to controls and the like. Window 76 is captivated within enclosure 70 and cassette 72 by a plurality of channels 77 which mate with the edges of the plastic window 76 in the preferred embodiment but this is not to be limiting. Other front panel arrangements may be suitable for other embodiments. Vents 42 are provided in the upper side and vents 43 on the lower side. Vents 42 and 43 are substantially larger than vent 37 so that the vacuum in the upper chamber is not significantly affected by addition or removal of a cassette.

The cassette ejector 22 is simply a pivoting lever mounted by pins 80 to appropriate apertures in cassette cover 72 and cassette enclosures 70. The cassette ejector 22 may be spring biased to allow automatic return to a desired location or may be permitted to pivot freely. The lower edge of cassette ejector 22 as well as the adjacent portion of cassette enclosure 70 are preferably tapered to allow a human finger to easily pull out the bottom thereof to lever the cassette out of the enclosure member. Cassette cover 72 and cassette enclosure 70 may be suitably attached together by a plurality of screws 82 or other suitable connectors to seal and protect the circuit board 74. The connector 20A protrudes from the rear of the cassette to allow mating with the enclosure 10.

In certain embodiments of the present invention, various bus connections may be required which are not provided for above. This may be accomplished either by a variation of the transition board or by ribbon cables or connectors protruding through one side of the cassette. Of course, such cassettes may be required to be located at one end of the assembly to allow access to such connectors. In other variations, other cassette structures may be used; e.g. clam shell or open side.

Figure 4:
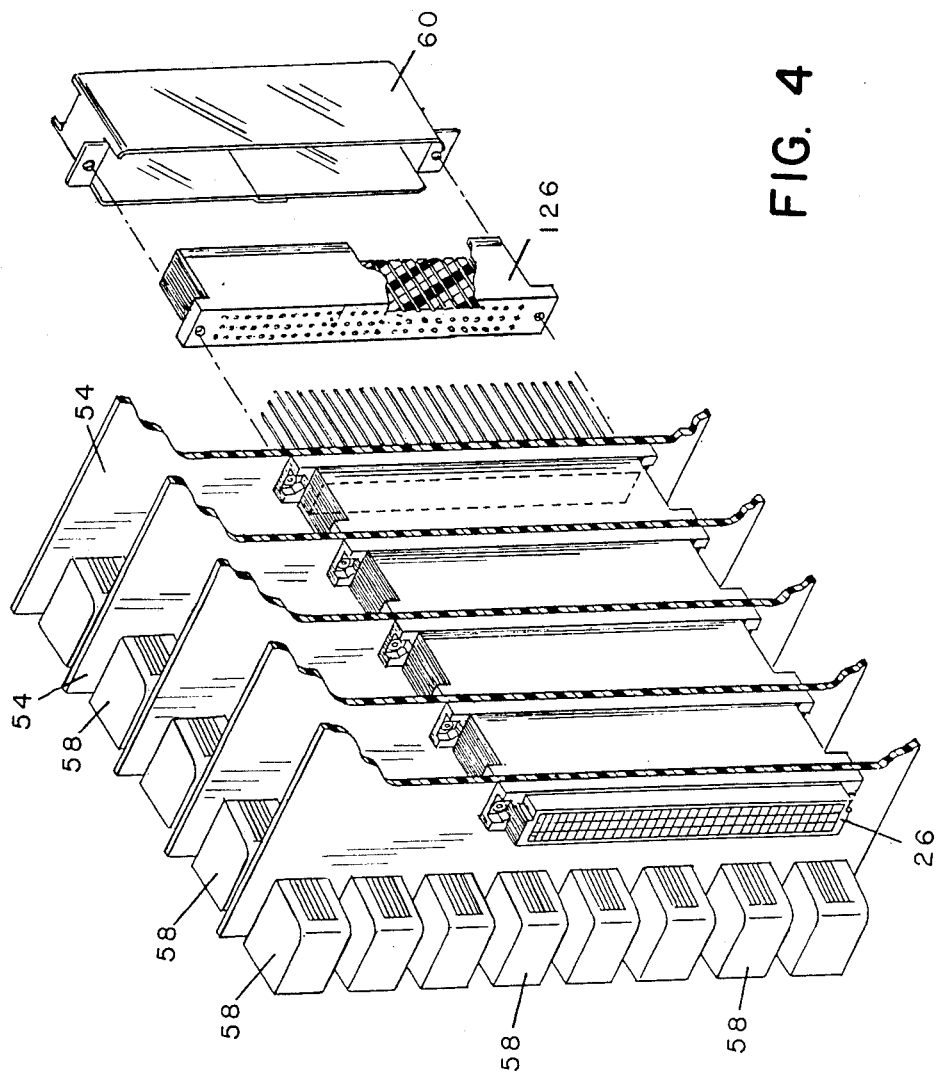
FIG. 4 shows a more detailed view of the expandable bus assembly of the present invention.

Turning now to FIG. 4, a view of the mating of the stackable connectors is shown. This view clearly shows the relationship of the stackable connectors, the transistor card assembly and the shield 60 when assembled together. Connector 126 is shown removed from its associated pins for clarity of illustration. The shield covers the stacking connector to effect electromagnetic shielding of the assembly. The stackable connector has a male part and a female part which fit on opposite sides of the transition card 54. The pins of the connector are press fit in holes in the transition card and the male and female parts are secured together by a screw or rivet or the like.

In the preferred embodiment the enclosure assemblies enclosure member 50 and cover 62 are made of molded plastic as are the cassette enclosure 70 and cassette cover 72. This provides an economical enclosure assembly which provides protection from handling to the circuit cards and allows individual cards to be removed via removal of the cassette without disassembly of the entire enclosure assembly. Thus a cassette can be removed which is located in the middle of a stack of modules without disturbing the operation of the remainder of the modules. The cassette can thus be serviced and returned the stack without having to power down the entire assembly.

In addition to housing circuit cards and power supplies, cassettes of various configurations may be provided as required to provide other functions. For example, tape drives and both floppy disk drives and hard (fixed) disk drives may be incorporated within cassettes in a similar manner with the drive controller mounted near the rear of the cassette for ready access to the stackable connector and the drive itself mounted near the front of the cassette for user access if required. Of course, the size of the cassette 14 and cassette enclosure member 10 may be varied as required to accommodate such requirements. In general, a typical circuit card may be housed in a standardized cassette having an overall thickness of about one inch. Another standard cassette may be provided having approximately three inches of thickness to accept standard 3.5 inch floppy and hard disk drives. The two sizes may be adapted to accept the majority of circuit needs.

It is also noted that by standardizing circuit board sizes, automation of assembly of such boards and enhanced economy of scale may be achieved by using the present invention.

Many variations of the present invention will occur to those skilled in the art. For example, air may be blown through the cassettes rather than aspirated in some instances. Many variations of the exact mechanical assembly of the enclosure, cassettes and connectors are possible. Such variations an modifications fall within the scope of the present invention.

Thus it is apparent that in accordance with the present invention an apparatus that fully satisfies the objectives, aims and advantages is set forth above. While the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and broad scope of the appended claims.

What is claimed is:

1. A modular housing for electronic apparatus, comprising in combination:
    an approximately C-shaped enclosure member having an inner portion and first and second major sides; said enclosure member including:
        a male stacking enclosure connector on said first major side;
        a female stacking enclosure connector on said second major side;
        said male stacking enclosure connector and said female stacking enclosure connector referenced collectively as stacking enclosure connector; and
        a first cassette connector situated at said inner portion;
    a cassette for carrying an electronic apparatus, said cassette being suitable for engaging said inner portion of said C-shaped enclosure member; said cassette including:
        a second cassette connector situated on said cassette and suitable for engagement with said first cassette connector; and
    slidable engaging means for slidably coupling said enclosure member and said cassette together, said engaging means including an elongated rail on said enclosure member and an elongated groove on said cassette, said rail being slidable within said groove to facilitate engagement and alignment of said cassette with said enclosure member.

2. The invention of claim 1, further comprising actuable ejecting means for facilitating removal of said cassette from said enclosure member, said ejecting means causing disengagement of said first and second connectors upon actuation thereof.

3. The invention of claim 1, further comprising:
    an intake vent situated on said cassette for receiving cooling air for cooling said electronic apparatus;
    an exhaust vent situated on said cassette for expelling exhaust air from said cassette;
    aspirating means, coupled to said enclosure member, for drawing said exhaust air from said cassette through said exhaust vent.

4. The invention of claim 1, further comprising an electrical connector coupled to a rear portion of said enclosure member.

5. The invention of claim 4, wherein said electrical connector includes an RJ-11 jack.

6. The invention of claim 1, wherein said enclosure member is a first enclosure member and said cassette is a first cassette, and further comprising:
    a second substantially C-shaped enclosure member coupled to said first enclosure member; and
    a second cassette engaged within said second enclosure member.

7. The invention of claim 1, further comprising a power supply module coupled to said stacking enclosure connector, for supplying D.C. power to said cassette.

8. The invention of claim 3, further comprising a power supply module coupled to said stacking enclosure connector and wherein said aspirating means includes an exhaust fan situated within said power supply module.

9. The invention of claim 1, further comprising an end cover mounted to said enclosure member.

10. An invention comprising in combination:

a housing having an approximately C-shaped opening for receiving a circuit card cassette, said housing having an upper chamber and a lower chamber;

an exhaust chamber having a vent suitable for mating with an exhaust vent in said cassette and for receiving exhaust air therefrom;

a transition circuit card within said housing;

cassette connector means attached to said circuit card and suitable for mating with a connector means on said circuit card cassette when said circuit card cassette is inserted within said housing; and stackable connector means, coupled to said transition circuit card and passing through said housing at an approximately normal angle with said cassette connector means, for mating with other circuit cards having a similar stackable connector means.

11. The invention of claim 10, further comprising a vent on a side of said upper chamber for mating with similar vents on other housing.

12. The invention of claim 11, further comprising an end cover for covering said vent on said side of said upper chamber.

13. The invention of claim 11, further comprising aspirating means coupled to said vent on said upper chamber for drawing exhaust air from said upper chamber.

14. The invention of claim 13, wherein said aspirating means includes a fan situated within a power supply module.

15. The invention of claim 10, further comprising shielding means for providing a substantially continuous electrical shield covering said stackable connector means.

16. The invention of claim 10, further comprising an electrical connector situated at a rear portion of said transistor card.

17. The invention of claim 16, wherein said electrical connector includes an RJ-11 jack.

18. An invention comprising in combination:

a housing having an approximately C-shaped opening for receiving a cassette circuit and said housing having an upper chamber and a lower chamber;

an exhaust chamber having a vent suitable for mating with an exhaust vent in said cassette and for receiving exhaust air therefrom;

a transition circuit card within said housing;

cassette connector means attached to said circuit card and suitable for mating with a connector means on said circuit card cassette when said circuit card cassette is inserted within said housing;

stackable connector means having a female portion coupled to said transition circuit card and passing through said housing at an approximately normal angle with said cassette connector means;

shielding means substantially shielding said female portion; so that when said female portion is mated together with a male portion of a second stackable connector means, said male portion of said second stackable connector means is also substantially shielded.

* * * * *